(12) United States Patent
Zhai et al.

(10) Patent No.: US 7,683,623 B2
(45) Date of Patent: Mar. 23, 2010

(54) RF VOLUME COIL WITH SELECTABLE FIELD OF VIEW

(75) Inventors: Zhiyong Zhai, Cleveland, OH (US); Michael A. Morich, Mentor, OH (US); Gordon D. DeMeester, Wickliffe, OH (US); Robert C. Gauss, Aurora, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 11/917,010

(22) PCT Filed: Jun. 13, 2006

(86) PCT No.: PCT/IB2006/051884
§ 371 (c)(1),
(2), (4) Date: Dec. 10, 2007

(87) PCT Pub. No.: WO2006/134557
PCT Pub. Date: Dec. 21, 2006

(65) Prior Publication Data
US 2008/0197848 A1    Aug. 21, 2008

Related U.S. Application Data

(60) Provisional application No. 60/691,113, filed on Jun. 16, 2005.

(51) Int. Cl.
*G01V 3/00* (2006.01)
(52) U.S. Cl. .................................................... 324/318
(58) Field of Classification Search ......... 324/300–324; 600/410–435; 333/219–235; 343/841–842, 343/876, 904–916, 700 MS
See application file for complete search history.

(56) References Cited

U.S. PATENT DOCUMENTS 6,479,999 B1    11/2002    DeMeester et al.

(Continued)

FOREIGN PATENT DOCUMENTS

WO      03098234 A2    11/2003

(Continued)

OTHER PUBLICATIONS

Alecci, M., et al.; Theoretical and Experimental Evaluation of Detached Endcaps for 3T Birdcage Coils; 2003; MRM: 49:363-370.

(Continued)

*Primary Examiner*—Brij B Shrivastav
*Assistant Examiner*—Dixomara Vargas (57) ABSTRACT

A radio frequency coil for magnetic resonance imaging or spectroscopy includes a plurality of generally parallel conductive members (70) surrounding a region of interest (14). One or more end members (72, 74) are disposed generally transverse to the plurality of parallel conductive members. A generally cylindrical radio frequency shield (32) surrounds the plurality of generally parallel conductive members. Switchable circuitry (80, 80') selectably has: (i) a first switched configuration (90, 90') in which the conductive members are operatively connected with the one or more end members; and (ii) a second switched configuration (92, 92') in which the conductive members are operatively connected with the radio frequency shield. The radio frequency coil operates in a birdcage resonance mode in the first switched configuration and operates in a TEM resonance mode in the second switched configuration.

16 Claims, 6 Drawing Sheets

U.S. PATENT DOCUMENTS

| | | | |
|---|---|---|---|
| 6,791,328 B1 * | 9/2004 | Nabetani et al. | 324/318 |
| 7,345,481 B2 * | 3/2008 | Leussler | 324/318 |
| 2002/0149367 A1 | 10/2002 | Boskamp et al. | |
| 2002/0165447 A1 | 11/2002 | Boskamp et al. | |
| 2004/0204642 A1 | 10/2004 | Ferris et al. | |

FOREIGN PATENT DOCUMENTS

| | | |
|---|---|---|
| WO | 2004048987 A2 | 6/2004 |
| WO | 2005050237 A1 | 6/2005 |
| WO | 2005050239 A1 | 6/2005 |

OTHER PUBLICATIONS

Baertlein, B. A., et al.; Theoretical Model for an MRI Radio Frequency Resonator; 2000; IEEE Trans. on Biomedical Engineering; 47(4)535-546.

Hayes, C. E. et al.; An Efficient, Highly Homogeneous Radiofrequency Coil for Whole-Body NMR Imaging at 1.5 T; 1985; J. Magnetic Resonance; 63:622-628.

Tropp, J.; The Theory of the Bird-Cage Resonator; 1989; J. Magnetic Resonance; 82:51-62.

Vaughan, J. T., et al.; High Frequency Volume Coils for Clinical NMR Imaging and Spectroscopy; 1994; MRM; 32:206-218.

* cited by examiner

RF VOLUME COIL WITH SELECTABLE FIELD OF VIEW

CROSS REFERENCE TO RELATED APPLICATIONS

This application claims the benefit of U.S. provisional application Ser. No. 60/691,113 filed Jun. 16, 2005, which is incorporated herein by reference.

DESCRIPTION

The following relates to the magnetic resonance arts. It finds particular application in high field magnetic resonance imaging and spectroscopy applications, such as imaging or performing spectroscopy at about 3 Tesla or higher, and will be described with particular reference thereto. However, it also finds application in magnetic resonance imaging or spectroscopy performed at lower magnetic fields, and in like applications.

In magnetic resonance imaging, an imaging subject is placed in a temporally constant main magnetic field and subjected to radio frequency (RF) excitation pulses to generate nuclear magnetic resonances in the imaging subject. Magnetic field gradients are superimposed on the main magnetic field to spatially encode the magnetic resonances. The spatially encoded magnetic resonances are read out and reconstructed based on the spatial encoding to generate magnetic resonance images.

There are various practical and functional advantages to designing magnetic resonance imaging scanners with shorter bores, typically around 1.2 meters or less. Similarly, there are various practical and functional advantages to designing magnetic resonance imaging scanners to operate at higher magnetic fields. Both shortening the bore length and increasing the magnetic field strength tend to lead to shorter whole body RF coils. When the whole-body coil is mounted with its z-axis coincident with the axis of the magnet bore, the $B_1$ field nonuniformity tends to be greatest along the z-axis of the whole-body coil. The $B_1$ field nonuniformity thus limits the usable field of view along the bore of the magnet.

Two common types of whole-body radio frequency coils are birdcage coils and TEM (Transverse Electromagnetic) coils. Birdcage coils have a plurality of rungs coupled with end rings or end caps. A surrounding radio frequency shield may be provided to shield components outside of the coil from the generated radio frequency signals, to block outside RF noise from reaching the coil, to suppress coil loading due to external lossy material, and so forth. The RF shield is not otherwise an active component of the birdcage coil. Shielded birdcage coils provide relatively low SAR (Specific energy Absorption Rate, or Specific Absorption Rate) and high coil sensitivity; however, the field of view along the z-axis is limited. The low SAR and high coil sensitivity makes birdcage coils attractive for use as the whole-body radio frequency coil in magnetic resonance imaging systems.

The TEM coil includes a plurality of rods that are connected with a surrounding radio frequency shield. Typically, the connections are made at the ends of the rods. In the TEM coil, the radio frequency shield is an active component of the coil, since the shield provides the current return paths for the TEM resonance. TEM coils provide a longer field of view along the z-axis compared with shielded birdcage coils of comparable dimensions; however, TEM coils typically have higher SAR and lower coil sensitivity compared with similar shielded birdcage coils. The large axial field of view of TEM coils makes these coils attractive for use as the whole-body radio frequency coil in high magnetic field imaging systems.

According to one aspect, a radio frequency coil is disclosed for magnetic resonance imaging or spectroscopy. A plurality of generally parallel conductive members surround a region of interest. One or more end members are disposed generally transverse to the plurality of parallel conductive members. A generally cylindrical radio frequency shield surrounds the plurality of generally parallel conductive members. Switchable circuitry selectably has: (i) a first switched configuration in which the conductive members are operatively connected with the one or more end members; and (ii) a second switched configuration in which the conductive members are operatively connected with the radio frequency shield. The radio frequency coil operates in a birdcage resonance mode in the first switched configuration and operates in a TEM resonance mode in the second switched configuration.

According to another aspect, a magnetic resonance scanner is disclosed. A radio frequency coil includes: a plurality of generally parallel conductive members surrounding a region of interest; one or more end members disposed generally transverse to the plurality of parallel conductive members; a generally cylindrical radio frequency shield surrounding the plurality of generally parallel conductive members; and switchable circuitry selectably having (i) a first switched configuration in which the conductive members are operatively connected with the one or more end members, and (ii) a second switched configuration in which the conductive members are operatively connected with the radio frequency shield. The radio frequency coil operates in a birdcage resonance mode in the first switched configuration and in a TEM resonance mode in the second switched configuration. A main magnet generates a static magnetic field in the region of interest. Magnetic field gradient coils selectively superimpose selected magnetic field gradients upon the static magnetic field in the region of interest. Coil switching circuitry are operatively connected with the switchable circuitry of the radio frequency coil to configure the coil in a selected one of the first switched configuration and the second switched configuration.

According to another aspect, a radio frequency coil is disclosed for magnetic resonance imaging or spectroscopy. A plurality of generally parallel conductive members are arranged around a region of interest. Circuitry selectably has: (i) a first configuration in which the conductive members operate in a birdcage resonance mode; and (ii) a second configuration in which the conductive members operate in a TEM resonance mode.

According to another aspect, a magnetic resonance method is disclosed. A main magnetic field is generated in a region of interest. Magnetic resonance is excited in the region of interest using a radio frequency coil including: a plurality of generally parallel conductive members arranged around the region of interest; and circuitry selectably having (i) a first configuration in which the conductive members operate in a birdcage resonance mode, and (ii) a second configuration in which the conductive members operate in a TEM resonance mode. A magnetic resonance signal is received using the radio frequency coil. The exciting is performed with the radio frequency coil in one of the first and second configurations, and the receiving is performed with the radio frequency coil in the other of the first and second configurations.

One advantage resides in providing a radio frequency coil having a selectable field of view.

Another advantage resides in providing a single whole body coil that enables a switchable tradeoff between (i) field of view and (ii) SAR and coil sensitivity.

Another advantage resides in providing a whole body radio frequency coil that is selectably switchable to a smaller field of view with lower SAR and higher coil sensitivity.

Another advantage resides in providing a single radio frequency coil that is switchable between two different resonance frequencies each with its own field of view.

Numerous additional advantages and benefits will become apparent to those of ordinary skill in the art upon reading the following detailed description of the preferred embodiments.

The invention may take form in various components and arrangements of components, and in various process operations and arrangements of process operations. The drawings are only for the purpose of illustrating preferred embodiments and are not to be construed as limiting the invention.

FIG. 2 shows a perspective view of the radio frequency coil of FIG. 1.

FIGS. 3A, 3B, 5A, and 5B show planar representations of the radio frequency coil including only four of the eight generally parallel conductive members illustrated in FIG. 2. Configurations with more or less than eight generally parallel conductive members are also contemplated.

Figure 1:
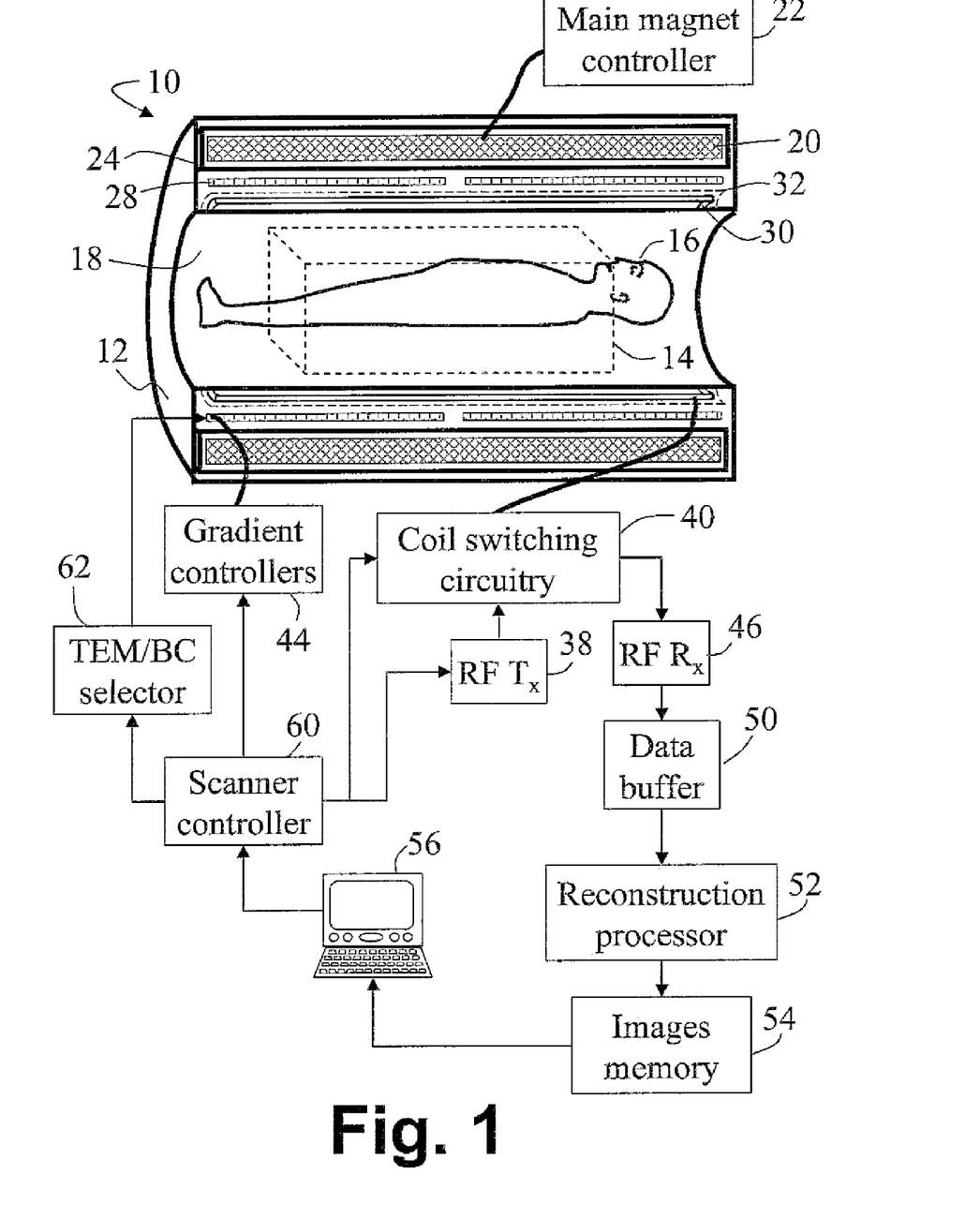
FIG. 1 diagrammatically shows an example magnetic resonance system including a radio frequency coil that is switchable between quadrature birdcage and TEM operating modes.

With reference to FIG. 1, a magnetic resonance scanner 10 for performing magnetic resonance imaging, magnetic resonance spectroscopy, voxel-localized magnetic resonance spectroscopy, or so forth includes a scanner housing 12 defining a region of interest 14 (indicated in phantom in FIG. 1) in which a patient or other subject 16 is at least partially disposed. A cosmetic bore liner 18 of the scanner housing 12 optionally lines a cylindrical bore or opening of the scanner housing 12 inside of which the subject 16 is disposed. A main magnet 20 disposed in the scanner housing 12 is controlled by a main magnet controller 22 to generate a $B_0$ main magnetic field at least in the region of interest 14. Typically, the main magnet 20 is a persistent superconducting magnet surrounded by cryoshrouding 24. The main magnet 20 generates a main magnetic field of typically about 3 Tesla or higher. In some embodiments, the main magnetic field is about 7 Tesla.

Magnetic field gradient coils 28 are arranged in or on the housing 12 to superimpose selected magnetic field gradients on the main magnetic field at least in the region of interest 14. Typically, the magnetic field gradient coils include coils for producing three orthogonal magnetic field gradients, such as an x-gradient, y-gradient, and z-gradient. A whole-body radio frequency coil 30 is disposed in housing 12, as shown, or in the bore of the scanner 10, to inject $B_1$ radio frequency excitation pulses and to measure magnetic resonance signals. The radio frequency coil 30 is generally cylindrical and coaxially aligned with the bore of the scanner 10, and includes a surrounding coaxial, generally cylindrical radio frequency shield 32.

During magnetic resonance data acquisition, a radio frequency power source 38 is coupled to the radio frequency coil 30 through radio frequency switching circuitry 40 to inject radio frequency excitation pulses into the region of interest 14 to generate magnetic resonance signals in a region of interest of the subject 16. For imaging or spectroscopy with spatial mapping, a magnetic field gradients controller 44 operates the magnetic field gradient coils 28 to spatially encode the generated magnetic resonances. For example, a one-dimensional magnetic field gradient applied during radio frequency excitation produces slice-selective excitation; magnetic field gradients applied between excitation and readout of magnetic resonances provide phase encoding; and magnetic field gradients applied during readout of magnetic resonances provide frequency encoding. The magnetic resonance pulse sequences can be configured to produce Cartesian, radial, spiral, or other spatial encodings.

During the magnetic resonance readout phase, the switching circuitry 40 disconnects the radio frequency transmitter 38 from the radio frequency coil 30, and connects a radio frequency receiver 46 to the radio frequency coil 30 to acquire spatially encoded magnetic resonances from the region of interest of the subject 16. The acquired spatially encoded magnetic resonances are stored in a data buffer 50, and are reconstructed by a reconstruction processor 52 to produce reconstructed images of the region of interest that are stored in an images memory 54. The reconstruction processor 52 employs a reconstruction algorithm that suitably decodes the spatially encoded magnetic resonances. For example, if Cartesian encoding is employed, a two or three dimensional fast Fourier transform (FFT) reconstruction algorithm may be suitable.

The reconstructed images are suitably displayed on a user interface 56 or on another high resolution display device, are printed, communicated over the Internet or a local area network, stored on a non-volatile storage medium, or otherwise used. In the embodiment of FIG. 1, the user interface 56 also interfaces a radiologist or other operator with a scanner controller 60 to control the magnetic resonance scanner 10. In other embodiments, a separate scanner control interface may be provided.

The scanner controller 60 further controls a TEM/birdcage selection circuit 62 which switches the radio frequency coil 30 to a birdcage or TEM mode to selectively allow use of the advantages of TEM or birdcage coils, within one MRI system, as appropriate for the clinical requirements. In some embodiments, the selection circuit 60 switches the radio frequency coil 30 with sufficient speed that the coil 30 can, for example, function as a TEM coil in some portions of a magnetic resonance sequence and as a birdcage coil in other portions of the sequence.

Figure 2:
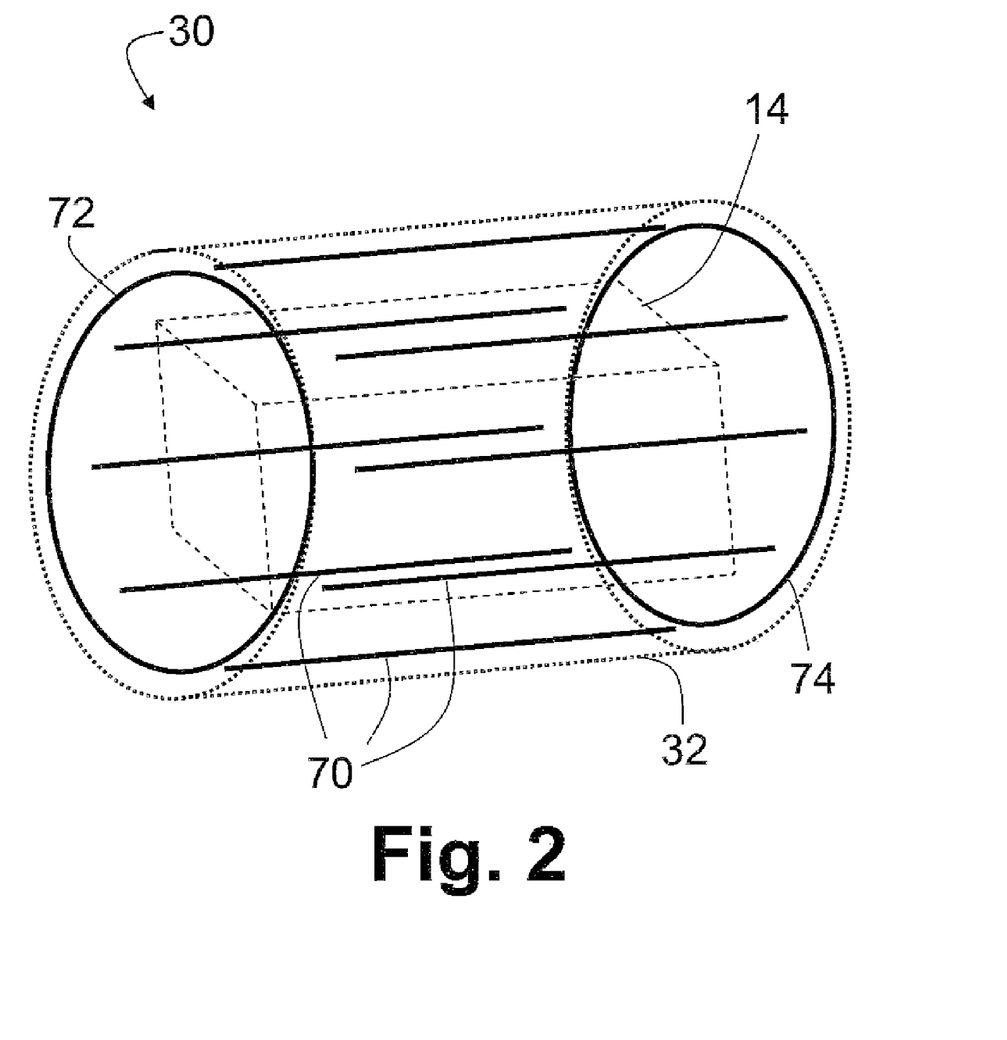
In FIG. 2, the radio frequency shield is drawn in phantom so that the interior coil elements are visible.

With continuing reference to FIG. 1 and with further reference to FIG. 2, the radio frequency coil 30 includes electrically conductive components 32, 70, 72, 74 of the radio frequency coil 30 include plurality of generally parallel conductive members, such as the illustrated eight parallel conductive members 70, surrounding the region of interest 14. The number of generally parallel conductive members can be greater or less than the illustrated eight conductive members 70. One or more end members are disposed generally transverse to the conductive members 70. In the embodiment illustrated in FIG. 2, the one or more end members include two illustrated end rings 72, 74 disposed proximate to opposite ends of the plurality of generally parallel conductive members 70 and arranged generally transverse to the conductive members 70. However, other types and numbers of end members can be used. For example, for head volume coils, one of the two end rings 72, 74 is in some embodiments replaced by an end cap. In some embodiments, a third or fourth end ring is added for resonance tuning or so forth. The plurality of generally parallel conductive members 70 are surrounded by the radio frequency shield 32. The electrically conductive component 32 may, for example, be a mesh screen or segmented conductor material. It is to be appreciated that in FIG. 2, the electrically conductive components 70, 72, 74 may have capacitors included in their paths as discussed next.

Figure 3A:
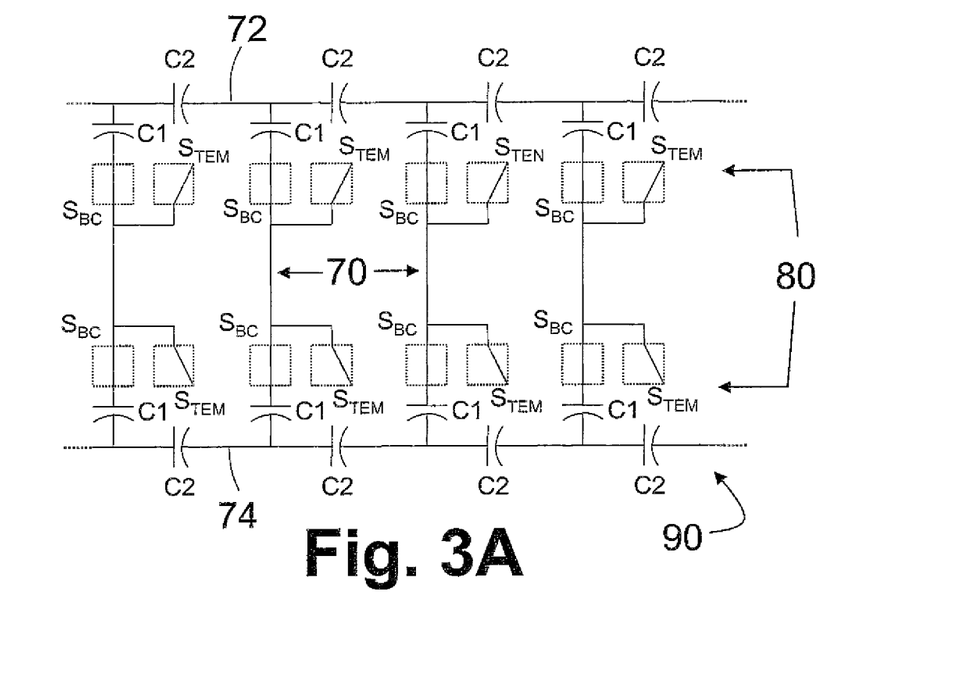
FIG. 3A shows a first switched configuration of the switchable circuitry of the radio frequency coil of FIGS. 1 and 2, in which the coil is configured to operate in a birdcage resonance mode.
Figure 3B:
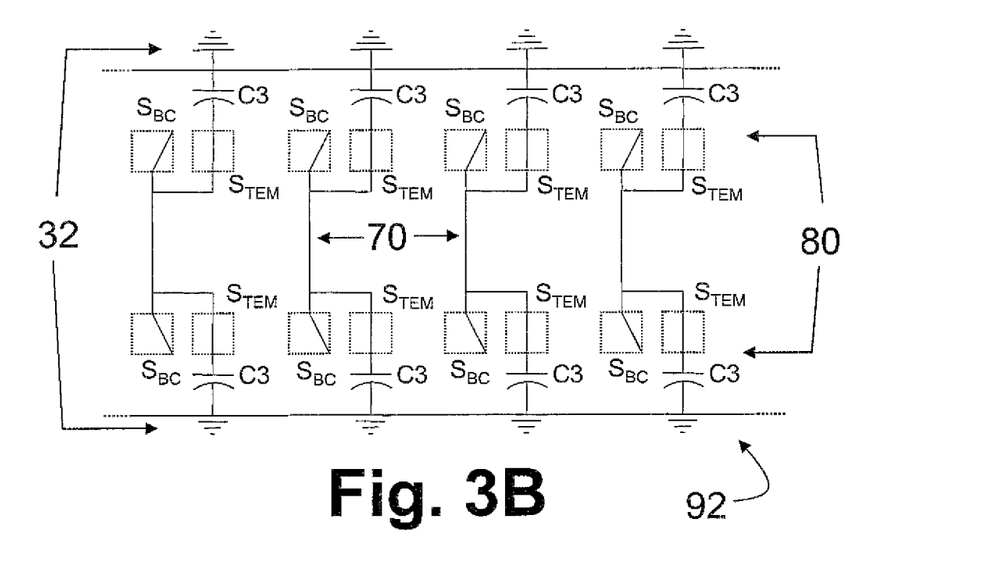
FIG. 3B shows a second switched configuration of the switchable circuitry of the radio frequency coil of FIGS. 1 and 2, in which the coil is configured to operate in a TEM resonance mode.

With continuing reference to FIGS. 1 and 2, and with further reference to FIGS. 3A and 3B, the radio frequency coil 30 is switchable between birdcage and TEM operating modes using switchable circuitry 80. FIG. 3A shows a first switched configuration 90 of the switchable circuitry 80, in which the coil 32 operates as a birdcage coil. FIG. 3B shows a second switched configuration 92 of the switchable circuitry 80, in which the coil 32 operates as a TEM coil. The TEM/birdcage selection circuit 62 is operatively connected with TEM switches $S_{TEM}$ and with birdcage switches $S_{BC}$ of the switchable circuitry 80 to configure the coil 30 in a selected one of the first switched configuration (birdcage mode) and the second switched configuration (TEM mode).

With particular reference to FIG. 3A, in the first switched configuration 90 the birdcage switches $S_{BC}$ are closed such that the conductive members 70 are operatively connected with the one or more end members 72, 74 so as to operate the coil 30 in the birdcage resonance mode. The TEM switches $S_{TEM}$ are open in the first switched configuration 90 to operatively disconnect the conductive members 70 from the radio frequency screen 32. In the birdcage resonance mode, the conductive members 70 serve as rungs of the birdcage mode coil, and the end members 72, 74 provide the current return paths. The resonance frequency in the birdcage mode is determined by the ratio of capacitances C1 and C2. More generally, first impedances (capacitances C1 in the illustrated example of FIG. 3A) connect the conductive members 70 with the end members 72, 74 in the first switched configuration 90. Each end ring 72, 74 interposes second impedances (capacitances C2 in the illustrated example of FIG. 3A) between neighboring conductive members 70 in the first switched configuration 90.

With particular reference to FIG. 3B, in the second switched configuration 92 the TEM switches $S_{TEM}$ are closed such that the conductive members 70 are operatively connected with the surrounding radio frequency shield 32 so as to operate the coil 30 in the TEM resonance mode. The birdcage switches $S_{BC}$ are open in the second switched configuration 92 to operatively disconnect the conductive members 70 from the end members 72, 74. In the TEM resonance mode, the conductive members 70 serve as rods of the TEM mode coil, and the radio frequency shield 32 provides the current return paths. The resonance frequency in the TEM mode is determined by the capacitances C3. More generally, third impedances (capacitances C3 in the illustrated example of FIG. 3B) connect the conductive members 70 with the radio frequency shield 32 in the second switched configuration 92.

The first, second, and third impedances are illustrated as discrete capacitances C1, C2, C3. More generally, each of the first impedances is selected from a group consisting of (i) a discrete capacitor, (ii) a distributed capacitance, (iii) a discrete inductor, and (iv) a distributed inductance. Each of the second impedances is selected from a group consisting of (i) a discrete capacitor, (ii) a distributed capacitance, (iii) a discrete inductor, and (iv) a distributed inductance. Each of the third impedances is selected from a group consisting of (i) a discrete capacitor, (ii) a distributed capacitance, (iii) a discrete inductor, and (iv) a distributed inductance. For example, in some embodiments, the conductive members 70 and/or the end members 72, 74 are microstrips, parallel-strip transmission lines, or the like, which define distributed capacitances.

In some embodiments, the first, second, and third impedances C1, C2, C3 are selected such that the birdcage resonance mode of the first switched configuration 90 and the TEM resonance mode of the second switched configuration 92 both resonate at the same frequency. Generally, the TEM resonance mode defines a field of view of magnetic resonance scanner 10 that is greater than the length of the plurality of generally parallel conductive members 70. In contrast, the birdcage resonance mode defines a field of view of magnetic resonance scanner 10 that is less than a length of the plurality of generally parallel conductive members 70. However, the birdcage resonance mode typically provides lower specific absorption rate (SAR) characteristics and higher coil sensitivity. Accordingly, in embodiments in which the birdcage resonance mode and the TEM resonance mode both resonate at the same frequency, the TEM mode is selected using the TEM/birdcage selection circuit 62 to image over a larger field of view at the expense of relatively higher SAR and relatively lower coil sensitivity. The birdcage mode is selected using the TEM/birdcage selection circuit 62 to image over a relatively smaller field of view but with lower SAR and higher coil sensitivity.

In other embodiments, the first, second, and third impedances C1, C2, C3 are selected such that the birdcage resonance mode of the first switched configuration 90 resonates at a first frequency corresponding to a first magnetic resonance frequency, and the TEM resonance mode of the second switched configuration 92 resonates at a second frequency corresponding to a second magnetic resonance frequency different from the first magnetic resonance frequency. These latter embodiments enable dual nuclei imaging or spectroscopy, for example by using one resonance mode to image or perform spectroscopy of $^1H$ proton resonances, and the other resonance mode to image or perform spectroscopy of $^{13}C$ resonances.

In the illustrated embodiment, the operative electrical length of the conductive members 70 is substantially the same in the both the first switched configuration 90 and the second switched configuration 92, because the switching circuitry 80 is disposed proximate to the ends of the conductive members 70. In some other contemplated embodiments, however, the operative electrical length of the conductive members 70 is smaller in the one coil configuration than in the other coil configuration. The birdcage coil configuration can be made smaller by moving the end members 72, 74 inward toward the center of the coil, which can provide further enhanced coil sensitivity and further reduced SAR in the birdcage mode. In other embodiments, the TEM coil is shorter, for example, to provide comparable fields of view for the TEM and birdcage configurations. In embodiments in which the TEM and birdcage resonance frequencies are different, such as to image or perform spectroscopy of different nuclear species, it is also contemplated to have a smaller operative electrical length of the conductive members 70 in the TEM mode, for example by moving the connection point of the TEM switches $S_{TEM}$ inward toward the center of the coil.

Figure 4A:
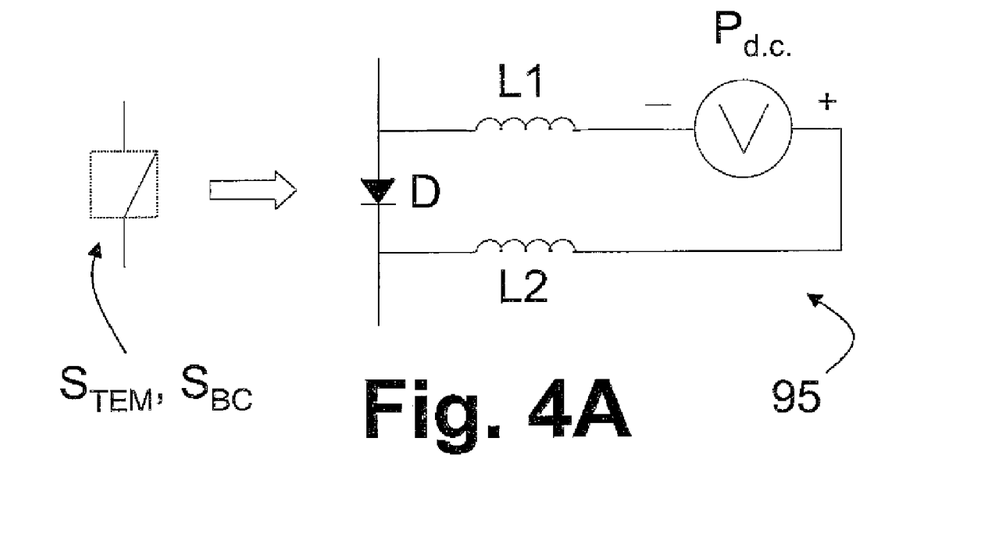
FIG. 4A shows the open setting of a suitable embodiment of the switches of the switchable circuitry of the radio frequency coil of FIGS. 1 and 2, in which a PIN diode is reverse-biased at d.c. to make the PIN diode electrically non-conductive at the magnetic resonance frequency.
Figure 4B:
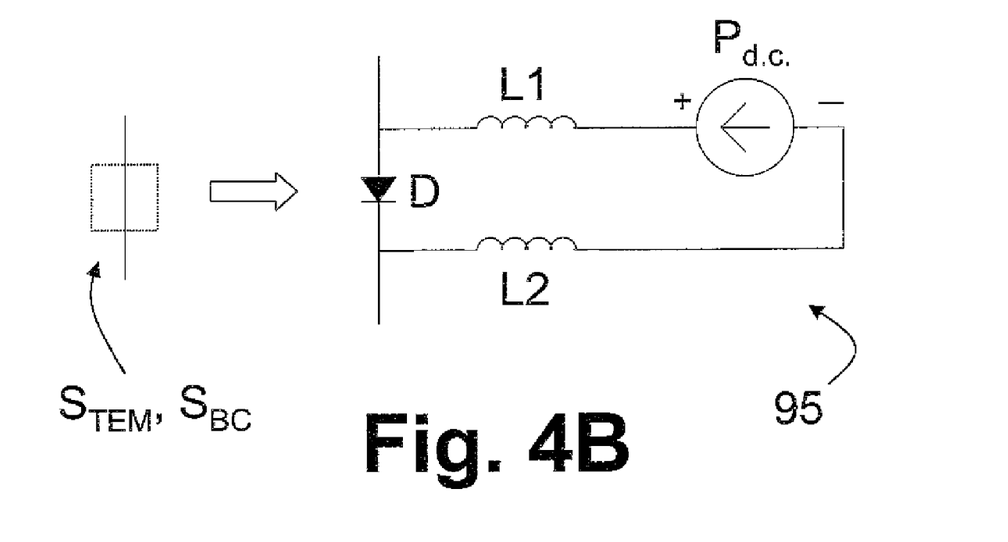
FIG. 4B shows the closed setting of the switch of FIG. 4A, in which the PIN diode is forward-biased at d.c. to make the PIN diode electrically conductive at the magnetic resonance frequency.

With reference to FIGS. 4A and 4B, in some embodiments the switches $S_{TEM}$ and $S_{BC}$ employ PIN diodes D biased by d.c. biasing circuitry 95. In the embodiment illustrated in FIGS. 4A and 4B, the d.c. biasing circuitry 95 includes a d.c. power supply $P_{d.c.}$ connected with the PIN diode D through radio frequency choke elements L1, L2. FIG. 4A shows the open switch state, in which the PIN diode D is reverse-biased and hence electrically nonconductive. FIG. 4B shows the closed switch state, in which the PIN diode D is forward-biased and hence electrically conductive. For forward biasing, a current d.c. power supply advantageously ensures a constant current through the PIN diode D. PIN diode switching is advantageously fast; accordingly, the coil 32 can be switched between TEM and birdcage resonance modes at speeds on the order of microseconds. Because of this fast switching, it is contemplated to switch resonance modes even within a magnetic resonance imaging or spectroscopy sequence. For example, the TEM resonance mode could be used for the transmit phase to provide longer or more uniform axial excitation coverage, and the birdcage mode used for the receive phase to provide higher coil sensitivity. Alternately, the birdcage resonance mode could be used for the transmit phase to reduce SAR, and the TEM mode used for the receive phase to provide longer or more uniform axial receive coverage. While PIN diodes D are illustrated, other electronically controllable switches can also be used, such as transistor-based or other solid-state electronic switches, electro-optical or photonic switches, or so forth. It is also contemplated for the switchable circuitry 80 to employ optical circuitry.

The d.c. biasing circuitry 95 is suitably incorporated into the TEM/birdcage selection circuit 62 (FIG. 1), which optionally also provides other coil switching capabilities such as selective coupling/decoupling of the radio frequency transmitter 38 and receiver 46. Moreover, it will be appreciated that the radio frequency coil 30 optionally includes various other controllable features, such as selectively operable detuning or decoupling diodes (not shown) that are suitably also controlled by the coil switching circuitry 40 or the TEM/birdcage selection circuit 62, to allow use of dedicated receive-only coils, such as surface receive-only coils.

Figure 5A:
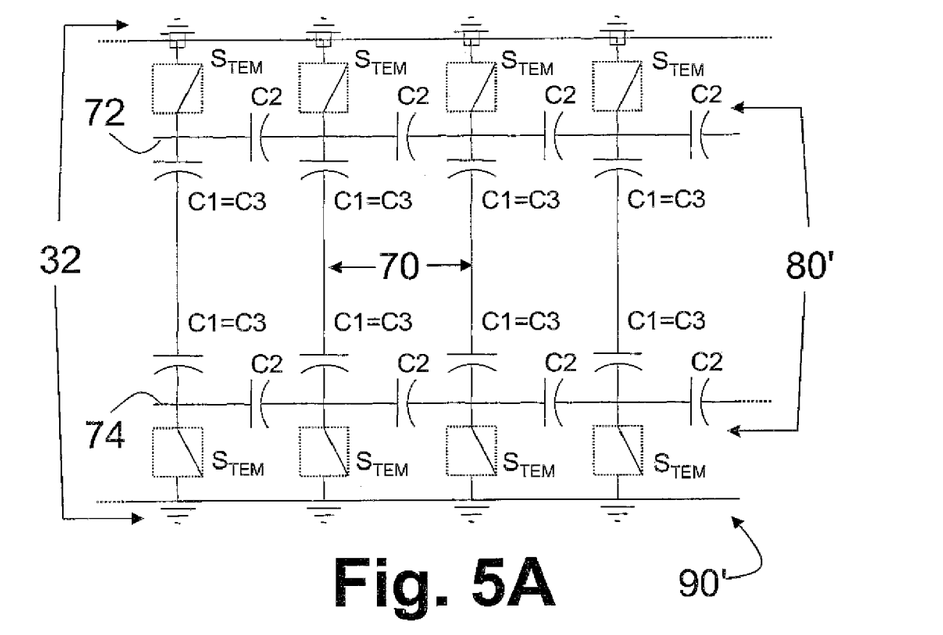
FIG. 5A shows a first switched configuration of modified switchable circuitry of the radio frequency coil of FIGS. 1 and 2, in which the coil is configured to operate in a birdcage resonance mode.
Figure 5B:
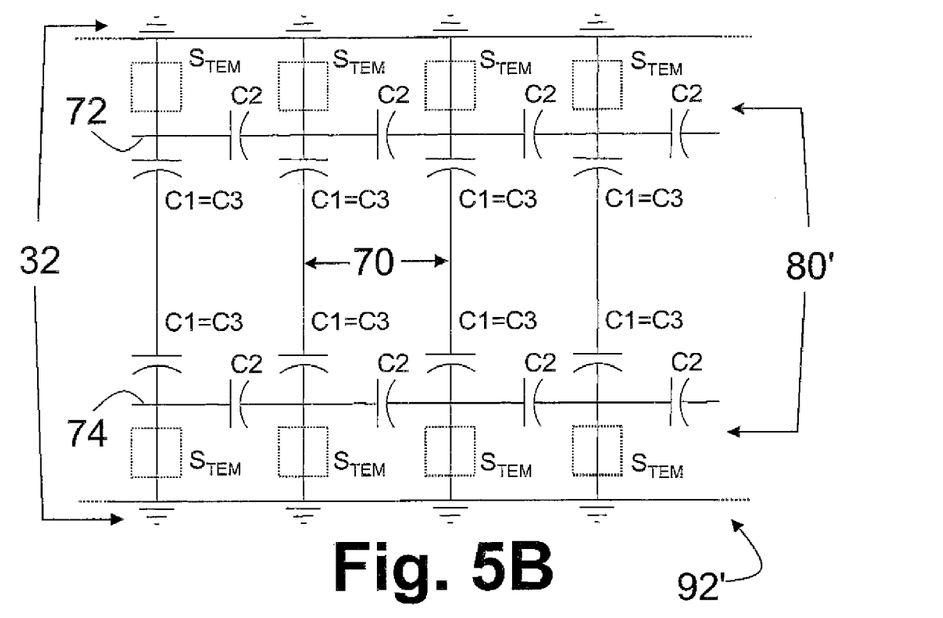
FIG. 5B shows a second switched configuration of modified switchable circuitry of the radio frequency coil of FIGS. 1 and 2, in which the coil is configured to operate in a TEM resonance mode.

With reference to FIGS. 5A and 5B, simplified switching circuitry 80' is illustrated, in which the birdcage switches $S_{BC}$ are omitted, and the value of the first impedances C1 is also suitable as the third impedances C3. For birdcage resonance operation, a modified first switched configuration 90' is similar to the first switched configuration 90, except that there are no birdcage switches $S_{BC}$ to close. The TEM switches $S_{TEM}$ are open to operatively disconnect the conductive members 70 from the radio frequency shield 32.

In a modified second switched configuration 92' for operating in TEM resonance mode, the TEM switches $S_{TEM}$ are closed to connect the conductive members 70 with the radio frequency shield 32 via the first impedances C1, and the third impedances C3 are omitted. This approach works since the capacitance of the first impedances C1 is also suitable for tuning the TEM resonance to the desired TEM resonance frequency. Since the birdcage resonance is determined by the ratio of capacitances C1 and C2, it is sometimes feasible to select a value of C1 that provides the desired TEM resonance frequency, and to select a value of C2 that provides the desired birdcage resonance frequency in conjunction with the selected C1 value. When using the modified switching circuitry 80', the birdcage and TEM resonance frequencies can be the same, or they can be different, depending upon the values of the impedances. In the modified second switched configuration 92', the second impedances C2 of the end rings 72, 74 are bypassed or shorted out by the closed TEM switches $S_{TEM}$ connecting portions of the radio frequency shield 32 in parallel across the second impedances C2 in the second switched configuration 92'.

The illustrated radio frequency coil 30 is a whole-body coil. Because of the large field of view provided in the TEM mode (which field of view can be substantially longer than the coil itself), in some embodiments the generally parallel conductive members 70 have a length of less than about 0.5 meters. Still shorter coils, such as coils having conductive members with a length of 0.4 meters or less, can be suitable for short-bore magnet scanners having bore lengths of about 1.2 meter or less.

To demonstrate the selectable field of view of the disclosed switchable volume coil used as a transmit/receive coil, a modeling study was conducted of a 16-element quadrature body coil operating at the resonance frequency of 128 MHz (3T). The modeled coil had a diameter of 60 centimeters and a length of 40 centimeters, which are typical coil dimensions for the whole-body coil of a typical high field magnetic resonance scanner. The modeled radio frequency shield had a diameter of 68 centimeters and a length of 100 centimeters. The conducting members were modeled as sixteen 2 centimeter-wide axial conducting strips, which were modeled as being connected to two end rings at the ends of the conducting strips. In modeling the TEM coil resonance mode, the axial conducting strips were modeled to be connected to the radio frequency shield by conducting strips placed in the radial direction. To reduce peak electric field near the parallel conducting members, four rung capacitors were modeled in each axial element. These rung capacitors were shared by both birdcage and TEM operating modes in the model simulations. End ring capacitors were placed in the two end rings to form a bandpass birdcage coil.

The simplified switching of FIGS. 5A and 5B was simulated. Each TEM switch $S_{TEM}$ was modeled by two resistors R1 and R2. The resistor R1 was placed in the end ring, while R2 was placed in one conducting strip that connects the one axial element to the radio frequency shield. To simulate the first switched configuration of FIG. 5A in which the TEM switches $S_{TEM}$ are open and the coil resonates in the birdcage mode, resistor R1 was set to 0.2 ohms to allow the current to flow to end rings, and resistor R2 was set to 10 kilo-ohms to block current flow to the RF shield. Conversely, to simulate the second switched configuration of FIG. 5B in which the TEM switches $S_{TEM}$ are closed and the coil resonates in the TEM mode, resistor R1 was set to 10 kilo-ohms to block rung current flow to the end rings, and resistor R2 was set to 0.2 ohms to allow the current to flow to the radio frequency shield. The radio frequency coil model was tuned to the resonance of 128 MHz (3T) with each end ring capacitor value of 22 pF and rung capacitor values of (32 pF, 16 pF, 16 pF, 32 pF).

Figure 6A:
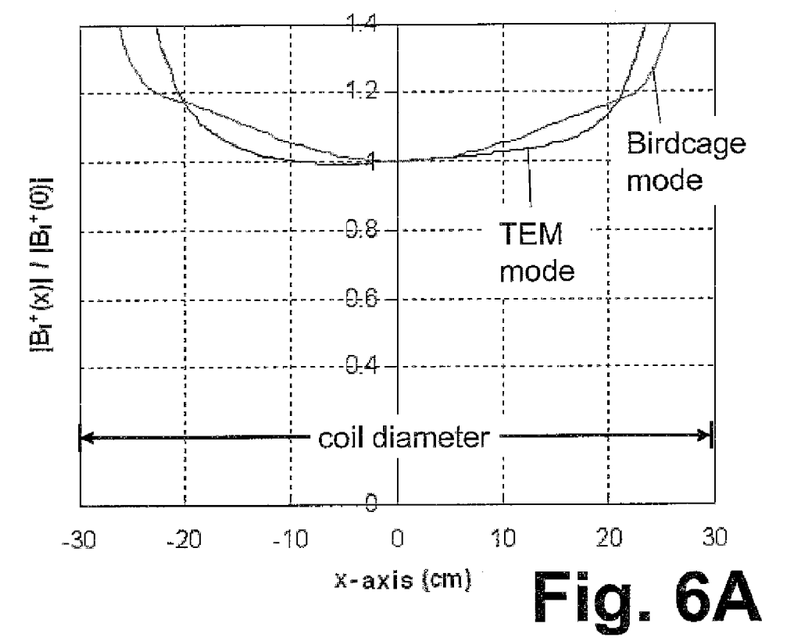
FIG. 6A shows a plot of a simulation of a radio frequency coil having the switchable circuitry of FIGS. 5A and 5B, comparing the $B_1$ field uniformity for the birdcage and TEM operating modes along the x-axis, an axis transverse to the coil axis.
Figure 6B:
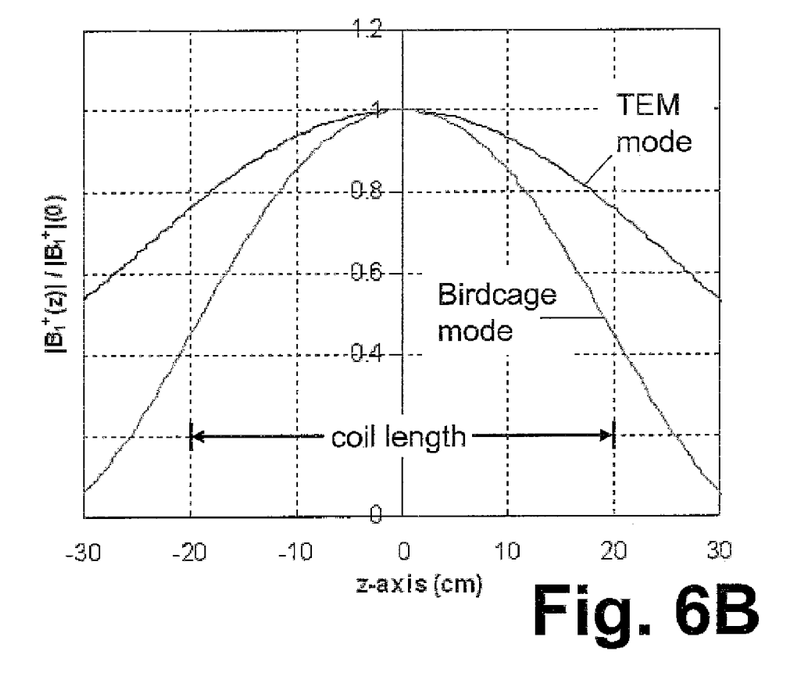
FIG. 6B shows a plot of the simulation of the radio frequency coil having the switchable circuitry of FIGS. 5A and 5B, comparing the $B_1$ field uniformity for the birdcage and TEM operating modes along the z-axis, the coil axis.

With reference to FIGS. 6A and 6B, the modeled normalized B1-field is plotted in rotating frame $[|B_1^+|/|B_1^+|(0)]$ along the x-axis (FIG. 6A) and z-axis (FIG. 6B) for the quadrature body coil operating in both TEM and birdcage modes. The Z=0 plane is the center plane of the coil, which has a length of 40 centimeters. In the transverse plane, the coil has comparable B1-field uniformity for both TEM and birdcage resonance modes. Along the z-axis, the switchable coil provides two fields of view that can be selected as needed. Designating the field of view as the region in which the $|B_1^+|$-field falls off by less than 50%, the field of view for the birdcage coil is 38 centimeters along the z-axis, which is slightly shorter than the coil length of 40 centimeters. In the TEM resonance mode, the field of view is 63 centimeters along the z-axis, which is substantially longer than the coil itself. By switching from birdcage to TEM operating modes, a field of view increase of 66% is achieved along the z-axis. This improvement of $B_1$-field uniformity along the z-axis should enable improved image quality for large field of view sagittal imaging, large field of view coronal imaging, and other types of imaging in which a large field of view is advantageous.

On the other hand, for certain transverse-slice imaging applications, a long field of view along the z-axis is not required. For these applications, switching to the birdcage resonance mode can advantageously improve coil sensitivity and reduce SAR. Defining the unloaded coil sensitivity as $S=(|B_1^+|$-field at isocenter)/(current amplitude in the coil rung), the birdcage mode was simulated as having coil sensitivity $S=2.0$ μT/A, while the TEM mode was simulated as having a lower coil sensitivity $S=0.7$ μT/A. The coil sensitivity of the birdcage mode is about three times higher than the coil sensitivity of the TEM mode.

Another advantage of using the birdcage resonance mode with its short field of view is the lower SAR. Limiting SAR is of particular interest in high field magnetic resonance imaging systems. The coil was simulated loaded with a realistic human body model in which the chest was centered at the isocenter. The calculated SAR values were scaled to have average $|B_1^+|$-field in the central transverse slice equal to 13.5 μT and were simulated with 1.35% of radio frequency duty-cycle. The loaded coil simulation results are summarized in Table I.

TABLE I

| Coil resonance mode | Whole body SAR (W/kg) | Partial body SAR (W/kg) | Max. Local SAR per 10 g-tissue in extremities (W/kg) | Max. Local SAR per 10 g-tissue in trunk (W/kg) |
|---|---|---|---|---|
| Birdcage | 1 | 2.3 | 20 | 7.4 |
| TEM | 2.9 | 5.6 | 29.4 | 38.9 |

It is seen from Table 1 that the birdcage mode, with its short field of view, has much lower whole body SAR, partial body SAR, and local SAR as compared with the corresponding values for the TEM mode. It is noted that the SAR values for the TEM coil mode could be reduced by adjusting rung capacitor values, adding more rung capacitors such that electric field is evenly distributed along the coil rungs, or so forth. However, the birdcage coil will typically retain the advantage of having a lower SAR as compared with a similar-sized TEM coil.

The illustrated radio frequency coil embodiments are whole-body coils. However, it will be appreciated that other types of radio frequency coils, such as head coils, torso coils, arm coils, leg coils, and so forth, can be constructed with the switchable circuitry 80, 80' to enable selectable operation in birdcage or TEM mode. Such local coils also can benefit from the ability to switch between a longer TEM field of view and a shorter birdcage field of view having lower SAR and higher coil sensitivity. Such local coils also can also benefit from the described embodiments in which the TEM and birdcage modes have different resonance frequencies, enabling imaging or spectroscopy of two different nuclear resonance species, such as the $^1$H and $^{13}$C resonances. Because of the high switching speed of the PIN diode-based switches $S_{TEM}$, $S_{BC}$, it is contemplated that two different nuclear resonance species could be imaged, or spectroscopy performed, in the same magnetic resonance sequence by interleaving. In this case, the two coil modes each excite and receive at a different resonance frequency and the RF transmitter 38 and RF receiver 46 support two or more frequencies of operation. Moreover, it is to be understood that the described radio frequency coils that are operable in either TEM or birdcage mode are suitable for use as receive coils, as transmit coils, or as combined transmit/receive (T/R) coils.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

Having described the preferred embodiments, the invention is now claimed to be:

1. A radio frequency coil for magnetic resonance imaging or spectroscopy, the coil comprising:

a plurality of generally parallel conductive members surrounding a region of interest;

one or more end members disposed generally transverse to the plurality of parallel conductive members;

a generally cylindrical radio frequency shield surrounding the plurality of generally parallel conductive members; and switchable circuitry selectably including TEM switches selectively connecting the conductive members with the radio frequency shield, the switchable circuitry having (i) a first switched configuration having the TEM switches open in which the conductive members are operatively connected with the one or more end members, and (ii) a second switched configuration having the TEM switches closed in which the conductive members are operatively connected with the radio frequency shield, the radio frequency coil operating in a birdcage resonance mode in the first switched configuration and operating in a TEM resonance mode in the second switched configuration, the switchable circuitry further selected from a group consisting of:

(i) in the second switched configuration the closed TEM switches and the radio frequency shield cooperatively define electrical bypasses that electrically bypass the one or more end members, and (ii) the switchable circuitry further includes birdcage switches selectively connecting the conductive members with the one or more end members, the first switched configuration having the birdcage switches closed and the second switched configuration having the birdcage switches open.

2. The radio frequency coil as set forth in claim 1, wherein the switchable circuitry includes:

first impedances connecting the conductive members with the end members in the first switched configuration; and third impedances connecting the conductive members with the radio frequency shield in the second switched configuration.

3. The radio frequency coil as set forth in claim 2, wherein the one or more end members include two end rings disposed proximate to opposite ends of the plurality of generally parallel conductive members and arranged generally transverse to the conductive members, each end ring interposing second impedances between neighboring conductive members in the first switched configuration.

4. The radio frequency coil as set forth in claim 3, wherein the first, second, and third impedances include first, second, and third capacitances, respectively.

5. The radio frequency coil as set forth in claim 3, wherein:
   each of the first impedances is selected from a group consisting of (i) a discrete capacitor, (ii) a distributed capacitance, (iii) a discrete inductor, and (iv) a distributed inductance;
   each of the second impedances is selected from a group consisting of (i) a discrete capacitor, (ii) a distributed capacitance, (iii) a discrete inductor, and (iv) a distributed inductance; and
   each of the third impedances is selected from a group consisting of (i) a discrete capacitor, (ii) a distributed capacitance, (iii) a discrete inductor, and (iv) a distributed inductance.

6. The radio frequency coil as set forth in claim 3, wherein the first, second, and third impedances are selected such that the birdcage resonance mode of the first switched configuration and the TEM resonance mode of the second switched configuration both resonate at the same frequency.

7. The radio frequency coil as set forth in claim 3, wherein the first, second, and third impedances are selected such that (i) the birdcage resonance mode of the first switched configuration resonates at a first frequency corresponding to a first magnetic resonance frequency and (ii) the TEM resonance mode of the second switched configuration resonates at a second frequency corresponding to a second magnetic resonance frequency different from the first magnetic resonance frequency.

8. The radio frequency coil as set forth in claim 1, wherein:
   each conductive member includes a first impedance;
   the one or more end members include two end rings disposed proximate to opposite ends of the plurality of generally parallel conductive members, each end ring being generally transverse to the conductive members and interposing second impedances between neighboring conductive members in the first switched configuration; and
   the second switched configuration bypasses the second impedances of the end rings by connecting portions of the radio frequency shield in parallel across the second impedances in the second switched configuration.

9. The radio frequency coil as set forth in claim 8, wherein the first and second impedances are selected such that the birdcage resonance mode of the first switched configuration and the TEM resonance mode of the second switched configuration both resonate at the same frequency.

10. The radio frequency coil as set forth in claim 1, wherein in the second switched configuration the closed TEM switches and the radio frequency shield operatively define electrical bypasses that electrically bypass the one or more end members.

11. The radio frequency coil as set forth in claim 1, wherein the switchable circuitry further includes:
    birdcage switches selectively connecting the conductive members with the one or more end members, the first switched configuration having the birdcage switches closed and the second switched configuration having the birdcage switches open.

12. The radio frequency coil as set forth in claim 1, wherein the TEM switches include electrically switchable PIN diodes.

13. The radio frequency coil as set forth in claim 1, wherein an operative electrical length of the conductive members is substantially the same in both the first switched configuration and the second switched configuration.

14. A radio frequency coil for magnetic resonance imaging or spectroscopy, the coil comprising:
    a plurality of generally parallel conductive members surrounding a region of interest;
    one or more end members disposed generally transverse to the plurality of parallel conductive members;
    a generally cylindrical radio frequency shield surrounding the plurality of generally parallel conductive members; and
    switchable circuitry selectably having (i) a first switched configuration in which the conductive members are operatively connected with the one or more end members, and (ii) a second switched configuration in which the conductive members are operatively connected with the radio frequency shield, the radio frequency coil operating in a birdcage resonance mode in the first switched configuration and operating in a TEM resonance mode in the second switched configuration, the switchable circuitry including PIN diodes and d.c. biasing circuitry biasing each PIN diode in a selected one of a conductive state and a nonconductive state.

15. A magnetic resonance scanner comprising:
    a radio frequency coil including a plurality of generally parallel conductive members surrounding an region of interest, one or more end members disposed generally transverse to the plurality of parallel conductive members, a generally cylindrical radio frequency shield surrounding the plurality of generally parallel conductive members, and switchable circuitry selectably having (i) a first switched configuration in which the conductive members are operatively connected with the one or more end members, and (ii) a second switched configuration in which the conductive members are operatively connected with the radio frequency shield, the radio frequency coil operating in a birdcage resonance mode in the first switched configuration and operating in a TEM resonance mode in the second switched configuration wherein (i) the birdcage resonance mode defines a field of view of magnetic resonance scanner that is less than or about equal to a length of the plurality of generally parallel conductive members, and (ii) the TEM resonance mode defines a field of view of magnetic resonance scanner that is greater than the length of the plurality of generally parallel conductive members;
    a main magnet generating a static magnetic field in the region of interest;
    magnetic field gradient coils selectively superimposing selected magnetic field gradients upon the static magnetic field in the region of interest; and
    a selection circuit operatively connected with the switchable circuitry of the radio frequency coil to configure the coil in a selected one of the first switched configuration and the second switched configuration.

16. A magnetic resonance scanner comprising:
a whole body radio frequency coil including:
- a plurality of generally parallel conductive members surrounding a region of interest, wherein the generally parallel conductive members have a length of less than about 0.5 meters
- one or more end members disposed generally transverse to the plurality of parallel conductive members,
- a generally cylindrical radio frequency shield surrounding the plurality of generally parallel conductive members, and
- switchable circuitry selectably having (i) a first switched configuration in which the conductive members are operatively connected with the one or more end members, and (ii) a second switched configuration in which the conductive members are operatively connected with the radio frequency shield, the radio frequency coil operating in a birdcage resonance mode in the first switched configuration and operating in a TEM resonance mode in the second switched configuration;

a main magnet generating a static magnetic field in the region of interest;

magnetic field gradient coils selectively superimposing selected magnetic field gradients upon the static magnetic field in the region of interest; and a selection circuit operatively connected with the switchable circuitry of the radio frequency coil to configure the coil in a selected one of the first switched configuration and the second switched configuration.

\* \* \* \* \*